United States Patent
Chan et al.

(10) Patent No.: US 9,030,855 B2
(45) Date of Patent: May 12, 2015

(54) SEMICONDUCTOR DEVICE, START-UP CIRCUIT HAVING FIRST AND SECOND CIRCUITS AND A SINGLE VOLTAGE OUTPUT TERMINAL COUPLED TO A SECOND NODE BETWEEN THE SEMICONDUCTOR UNIT AND THE FIRST CIRCUIT, AND OPERATING METHOD FOR THE SAME

(75) Inventors: Wing-Chor Chan, Hsinchu (TW); Chih-Min Hu, Kaohsiung (TW); Li-Fan Chen, Hsinchu (TW)

(73) Assignee: Macronix International Co., Ltd., Hsingchu (TW)

( * ) Notice: Subject to any disclaimer, the term of this patent is extended or adjusted under 35 U.S.C. 154(b) by 224 days.

(21) Appl. No.: 13/182,966

(22) Filed: Jul. 14, 2011

(65) Prior Publication Data

US 2013/0015888 A1    Jan. 17, 2013

(51) Int. Cl.
*H02M 1/00*    (2006.01)
*H02M 1/36*    (2007.01)
*H02M 3/335*    (2006.01)

(52) U.S. Cl.
CPC .............. *H02M 1/36* (2013.01); *H02M 3/335* (2013.01); *Y10S 323/901* (2013.01)

(58) Field of Classification Search
USPC ............. 363/49, 50, 55, 56.01; 323/901, 908, 323/238, 282, 313, 321
See application file for complete search history.

(56) References Cited

U.S. PATENT DOCUMENTS

| | | | |
|---|---|---|---|
| 5,534,768 A * | 7/1996 | Chavannes et al. ........... 323/267 |
| 5,581,453 A | 12/1996 | Ueta et al. | |
| 5,986,293 A * | 11/1999 | Suzuki et al. ................ 257/203 |
| 6,218,891 B1 * | 4/2001 | Lotfi et al. ..................... 327/431 |
| 6,294,941 B1 * | 9/2001 | Yokosawa .................... 327/309 |
| 6,385,028 B1 * | 5/2002 | Kouno .......................... 361/111 |
| 7,221,128 B2 * | 5/2007 | Usui et al. ...................... 363/49 |
| 7,619,450 B2 * | 11/2009 | Grasso et al. ................ 327/143 |
| 7,719,363 B2 * | 5/2010 | Wong ............................ 330/298 |

(Continued)

FOREIGN PATENT DOCUMENTS

| | | |
|---|---|---|
| DE | 102009033280 A1 | 3/2011 |
| EP | 1231640 A1 | 8/2002 |
| EP | 0651310 B1 | 11/2004 |
| JP | 59145287 | 9/1984 |
| JP | 9201047 A | 7/1997 |

OTHER PUBLICATIONS

TW Office Action dated Nov. 21, 2013.
English Abstract translation for DE102009033280 (Published Mar. 24, 2011).
CN Office Action dated Apr. 15, 2014.
English Abstract of JP59145287 (Published Sep. 28, 1984).

*Primary Examiner* — Jue Zhang
*Assistant Examiner* — Lakaisha Jackson
(74) *Attorney, Agent, or Firm* — McClure, Qualey & Rodack, LLP

(57) ABSTRACT

A semiconductor device, a start-up circuit, and an operating method for the same are provided. The start-up circuit comprises a semiconductor unit, a first circuit, a second circuit, a voltage input terminal and a voltage output terminal. The first circuit is constituted by one diode or a plurality of diodes electrically connected to each other in series. The second circuit is constituted by one diode or a plurality of diodes electrically connected to each other in series. The semiconductor unit is coupled to a first node between the first circuit and the second circuit. The voltage input terminal is coupled to the semiconductor unit. The voltage output terminal is coupled to a second node between the semiconductor unit and the first circuit.

18 Claims, 4 Drawing Sheets

(56) References Cited

U.S. PATENT DOCUMENTS

| | | |
|---|---|---|
| 7,898,297 B2 | 3/2011 | Kapoor et al. |
| 8,054,596 B2 * | 11/2011 | Koyama et al. ................. 361/56 |
| 2005/0190633 A1 | 9/2005 | Kang et al. |
| 2006/0125012 A1 | 6/2006 | Fathimulla |
| 2007/0030048 A1 | 2/2007 | Nakamura |
| 2008/0175045 A1 | 7/2008 | Lin |
| 2009/0143032 A1 * | 6/2009 | Ojanen et al. .............. 455/127.1 |
| 2012/0014145 A1 * | 1/2012 | Koike ............................ 363/49 |

* cited by examiner

SEMICONDUCTOR DEVICE, START-UP CIRCUIT HAVING FIRST AND SECOND CIRCUITS AND A SINGLE VOLTAGE OUTPUT TERMINAL COUPLED TO A SECOND NODE BETWEEN THE SEMICONDUCTOR UNIT AND THE FIRST CIRCUIT, AND OPERATING METHOD FOR THE SAME

BACKGROUND

1. Technical Field

The disclosure relates in general to a semiconductor device, a start-up circuit and an operating method for the same, and more particularly to a start-up circuit applied for a power supply device and an operating method for the same.

2. Description of the Related Art

In recent years, green power technique has attracted attention. It is developed with a trend towards high conversion efficiency and low standby power consumption. A HV process has been widely used for a power supply such as a switch mode power supply. A switch mode power IC is formed by integrating a start-up circuit and a PWM circuit. A conventional start-up circuit for a HV device uses a resistor for providing a charging current to a charging capacitor until a voltage on the capacitor is achieved to a starting voltage of the PWM circuit. Then, the start-up circuit stops working. However, after stopping working, the resistor of the start-up circuit still dissipate powers. Therefore, power saving effect of the device is not good. In some techniques, the start-up circuit uses a depletion-type NMOS replacing the resistor. However, as the start-up circuit is in a stopping condition, a high leakage current through the depletion-type NMOS would be easily generated due to a strong negative threshold voltage (Vt).

SUMMARY

A start-up circuit is provided. The start-up circuit comprises a semiconductor unit, a first circuit, a second circuit, a voltage input terminal and a voltage output terminal. The first circuit is constituted by one diode or a plurality of diodes electrically connected to each other in series. The second circuit is constituted by one diode or a plurality of diodes electrically connected to each other in series. The semiconductor unit is coupled to a first node between the first circuit and the second circuit. The voltage input terminal is coupled to the semiconductor unit. The voltage output terminal is coupled to a second node between the semiconductor unit and the first circuit.

An operating method for a start-up circuit is provided. The start-up circuit comprises a semiconductor unit, a first circuit, a second circuit, a voltage input terminal and a voltage output terminal. The first circuit is constituted by one diode or a plurality of diodes electrically connected to each other in series. The second circuit is constituted by one diode or a plurality of diodes electrically connected to each other in series. The semiconductor unit is coupled to a first node between the first circuit and the second circuit. The voltage input terminal is coupled to the semiconductor unit. The voltage output terminal is coupled to a second node between the semiconductor unit and the first circuit. The operating method for the start-up circuit comprises following steps. An input voltage is provided to the voltage input terminal to generate an electric current flowing from the voltage input terminal, through the semiconductor unit, to the voltage output terminal to generate an output voltage at the voltage output terminal. The output voltage forms a reverse bias to the diodes of the first circuit and the second circuit.

A semiconductor device is provided. The semiconductor device comprises a semiconductor unit, a first diode element and a second diode element. The semiconductor unit comprises a source, a drain and a gate between the source and the drain. The first diode element is coupled between the source and the gate. The gate is coupled to a first node between the first diode element and the second diode element.

DETAILED DESCRIPTION

Figure 1:
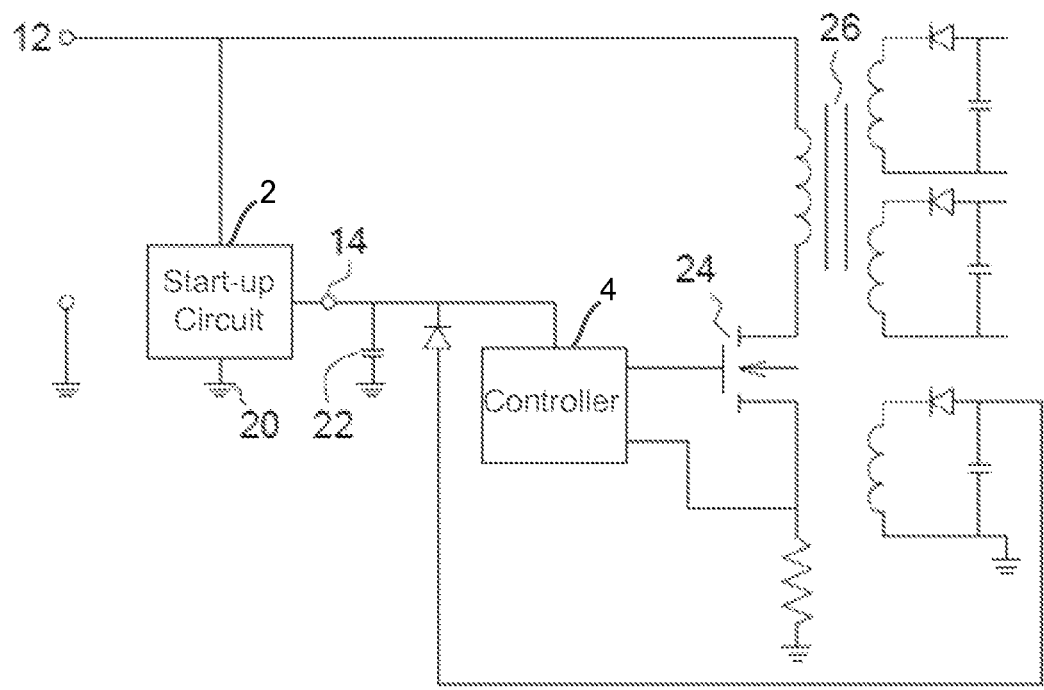
FIG. 1 illustrates a circuit of a semiconductor device in one embodiment.
Figure 2:
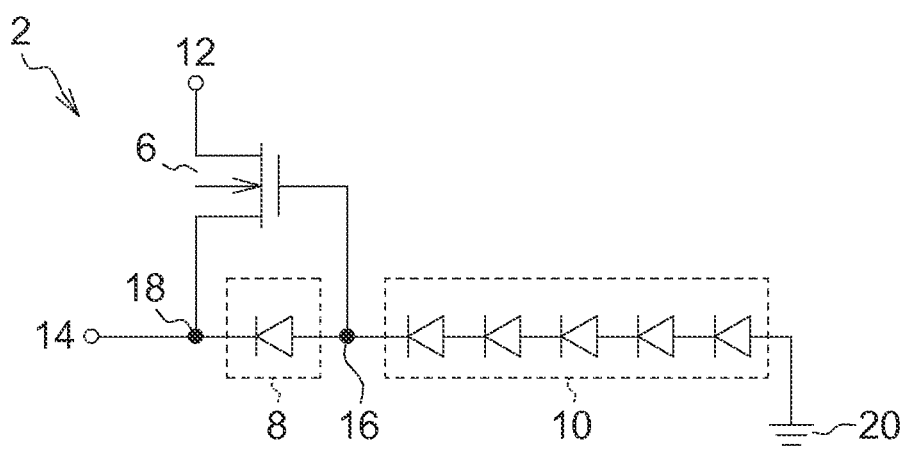
FIG. 2 illustrates a start-up circuit in one embodiment.
Figure 3:
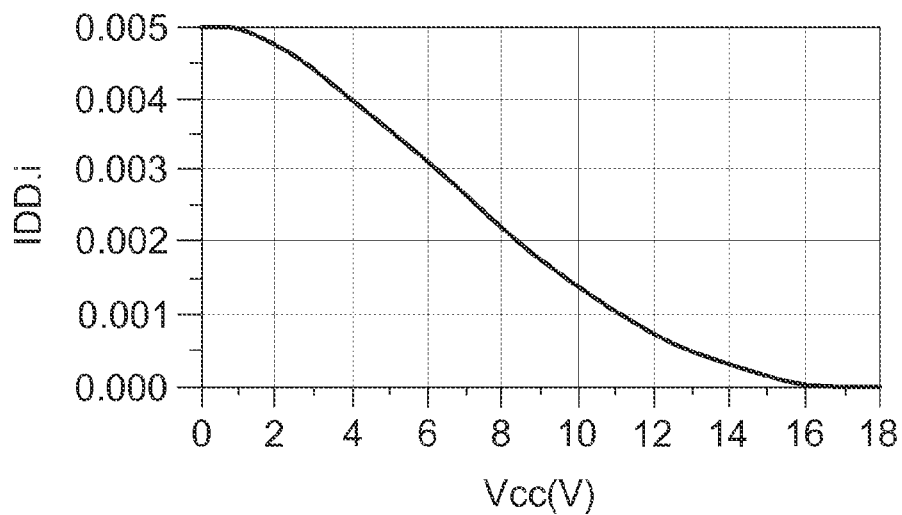
FIG. 3 illustrates an output voltage-current curve of a semiconductor unit in one embodiment.

FIG. 1 illustrates a circuit of a semiconductor device in one embodiment. FIG. 2 illustrates a start-up circuit in one embodiment. FIG. 3 illustrates an output voltage-current curve of a semiconductor unit in one embodiment.

Referring to FIG. 1, the semiconductor device may be a power supply such as a switch mode power supply. During operating the semiconductor device, an input voltage (Vin) is provided to a first voltage terminal 12 so as to generate an output voltage (Vcc) at a second voltage terminal 14 through a start-up circuit 2 and charge a capacitor 22. As a voltage on the capacitor 22 reaches a starting voltage of a switch mode controller 4 such as pulse width modulation (PWM) circuit, the switch mode controller 4 starts to control a power switch 24 such as enhancement type MOS to work. A transformer 26 is switched by the power switch 24 so as to generate a power. After the starting step is completed, the start-up circuit 2 stops working.

Referring to FIG. 2, the start-up circuit 2 comprises a semiconductor unit 6, a first circuit 8 and a second circuit 10. The first circuit 8 as shown in FIG. 2 is constituted by one diode. However, the present disclosure is not limited thereto. In other embodiments, the first circuit 8 is constituted by a plurality of diodes electrically connected to each other in series. The second circuit 10 as shown in FIG. 2 is constituted by a plurality of diodes electrically connected to each other in series. However, the present disclosure is not limited thereto. In other embodiments, the second circuit 10 is constituted by one diode. The diodes of the first circuit 8 and the second circuit 10 may comprise P-N junction diode, Zener diode, or Schottky diode. In some embodiments, the semiconductor unit 6 comprises a MOS such as a depletion-type MOS as shown in FIG. 2. However, the present disclosure is not limited thereto. In other embodiments, the semiconductor unit 6 may comprise a lateral double diffusion MOS (LDMOS), a double diffusion drain (DDD) MOS or an extension drain MOS (EDMOS).

A gate of the semiconductor unit 6 is coupled to a first node 16 between the first circuit 8 and the second circuit 10. The first voltage terminal 12 is coupled to a drain of the semiconductor unit 6. The second voltage terminal 14 is coupled to the first circuit 8 and a source of the semiconductor unit 6. In particular, the second voltage terminal 14 is coupled to a second node 18 between the first circuit 8 and the source. In embodiments, the second voltage terminal 14 is also coupled to a base electrode adjacent to the source of the semiconductor unit 6. A third voltage terminal 20 is coupled to a terminal of the diode of the second circuit 10 far from the first node 16. In embodiments, the first voltage terminal 12 is a voltage input terminal (Vin). The second voltage terminal 14 is a voltage output terminal (Vcc). The third voltage terminal 20 is a ground terminal (GND).

Referring to FIG. 2, in a operating method for the start-up circuit 2, an input voltage (Vin) is provided to the first voltage terminal 12 to generate an electric current flowing from the first voltage terminal 12, through the semiconductor unit 6, to the second voltage terminal 14 to generate an output voltage (Vcc) at the second voltage terminal 14. The output voltage of the second voltage terminal 14 forms a reverse bias to the diodes of the first circuit 8 and the second circuit 10. In embodiments, a condition such as amount of the diodes of the first circuit 8 and the second circuit 10 can be adjusted according to a desired output voltage (Vcc) and a characteristic such as threshold voltage (Vt) of the semiconductor unit 6. A high output voltage can be obtained. For example, an amount of the diode of the first circuit 8:an amount of the diode of the second circuit 10 may be 1:1~8, etc.

Referring to FIG. 2, for example, in particular, the semiconductor unit 6 is a depletion-type NMOS. The threshold voltage of the semiconductor unit 6 is −3V. The gate is coupled to the anode of the diode of the first circuit 8 and the cathode of the diode of the second circuit 10. The first voltage terminal 12 (voltage input terminal) is coupled to the drain. The second voltage terminal 14 (voltage output terminal) is coupled to the source (and the base electrode) and the cathode of the diode of the first circuit 8. The anode of the diode of the second circuit 10 is coupled to the third voltage terminal 20 (ground terminal). In this case, the first circuit 8 and the second circuit 10 uses the diodes having substantially the same characteristic, such as reverse breakdown voltage, as each other. For example, as the input voltage of first voltage terminal 12 is 18V, the output voltage of the second voltage terminal 14 is also 17.8V substantially close to the input voltage of first voltage terminal 12. The output voltage generates division biases to the diodes of the first circuit 8 and the second circuit 10. In detail, a bias voltage of the second circuit 10 generated due to the output voltage is substantially five-sixths (a ratio of an amount of the diode of the second circuit 10 to an whole amount of the diodes of the first circuit 8 and the second circuit 10) of the output voltage. A bias voltage of the first circuit 8 generated due to the output voltage is substantially one-sixth (a ratio of an amount of the diode of the first circuit 8 to the whole amount of the diodes of the first circuit 8 and the second circuit 10) of the output voltage. Therefore, as a voltage difference ($V_{GS}$) between the gate and the source of the semiconductor unit 6 is −3V for example, the $|V_{GS}|$ is substantially higher than the threshold voltage and the semiconductor unit 6 is cut off as shown in FIG. 3. In addition, additional power dissipation is not generated. In a condition that the input voltage is smaller than 18V, the VGS of the semiconductor unit 6 would not achieve to the threshold voltage. Therefore, the semiconductor unit 6 is kept in an on state for providing a charging voltage continuously. In embodiments, a constant current source can be applied.

Figure 4:
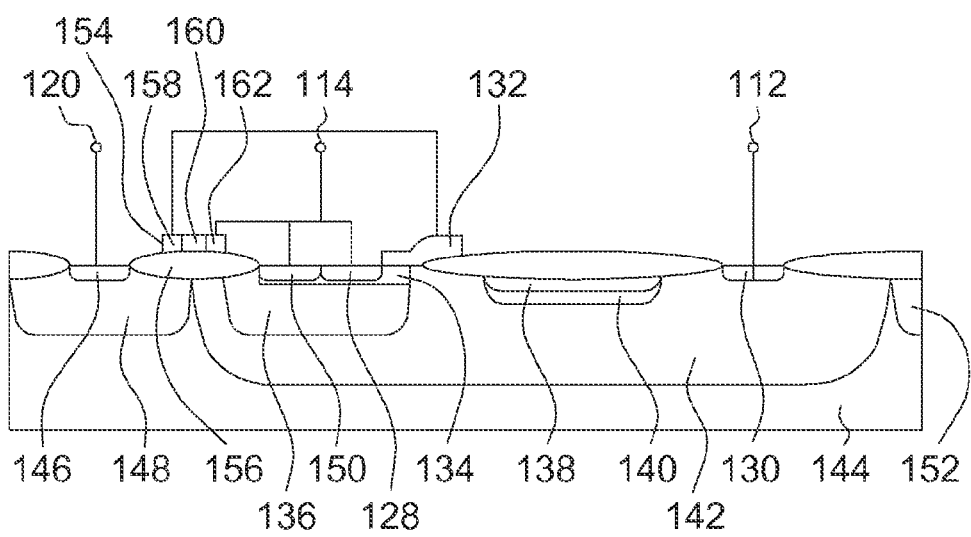
FIG. 4 illustrates a cross-section view of a semiconductor device in one embodiment.

FIG. 4 illustrates a cross-section view of a semiconductor device in one embodiment. The semiconductor device may have the circuit as shown in FIG. 1 and FIG. 2. The semiconductor device comprises the semiconductor unit. The semiconductor unit comprises a source 128, the drain 130 and the gate 132 between the source 128 and the drain 130. The source 128 and a doped region 150 are formed in a doped region 134. In embodiments, the doped region 150 is used as the base electrode. The doped region 134 is formed in a doped region 136. A doped region 138 is formed in a doped region 140. The drain 130, the doped region 136 and the doped region 140 are formed in a doped region 142. The doped region 142 is formed in a substrate 144. A doped region 146 is formed in a doped region 148. The doped region 148 and a doped region 152 are formed in the substrate 144.

In one embodiment, the semiconductor unit is a depletion-type NMOS. The source 128, the drain 130, the doped region 134, the doped region 138 and the doped region 142 have a first type conductivity such as N type conductivity. The doped region 150, the doped region 136, the doped region 140, the doped region 146, the doped region 148, the doped region 152 and the substrate 144 have a second type conductivity such as P type conductivity opposite to the first type conductivity. The source 128, the drain 130, the doped region 146 and the doped region 150 are heavily doped. The doped region 150 is used as the base electrode.

Referring to FIG. 4, the diode 154 is separated from the semiconductor unit by the dielectric structure 156. The dielectric structure 156 may be a field oxide (FOX) as shown in FIG. 4. However, the present disclosure is not limited thereto. The dielectric structure 156 may comprise a shallow trench isolation (STI), deep trench isolation, etc. The diode 154 may be formed by poly silicon. The diode 154 may comprise a part 158, a part 160 and a part 162. For example, the part 160 and the part 162 have the first type conductivity such as N type conductivity. The part 158 has the second type conductivity such as P type conductivity opposite to the first type conductivity. The part 158 and the part 162 are heavily doped, and a dopant concentration of the part 160 is smaller than dopant concentrations of the part 158 and the part 162. In one embodiment, the diode 154 is the diode of the first circuit 8 as shown in FIG. 2. In some embodiments, the 154 is formed by using two parts both heavily doped, respectively having opposite conductivity types and directly contact with each other. In other embodiments, the diode 154 may be formed by a doped structure of P+/NW, P+/HVNW, P+/NWD or N+/PWI.

The first voltage terminal 112 is coupled to the drain 130. The second voltage terminal 114 is coupled to the source 128, the part 162 of the diode 154 and the doped region 150. The part 158 of the diode 154 is coupled to the gate 132. The third voltage terminal 120 is coupled to the doped region 146. In some embodiments, the first voltage terminal 112 is the voltage input terminal. The second voltage terminal 114 is the voltage output terminal. The third voltage terminal 120 is the ground terminal. The part 158 is the anode of the diode 154. The part 162 is the cathode of the diode 154.

In embodiments, the semiconductor device may be manufactured by a standard HV process. Therefore, additional mask or manufacturing step is not need. The semiconductor device may be formed by using SOI, EPI, or non-EPI process.

Figure 5:
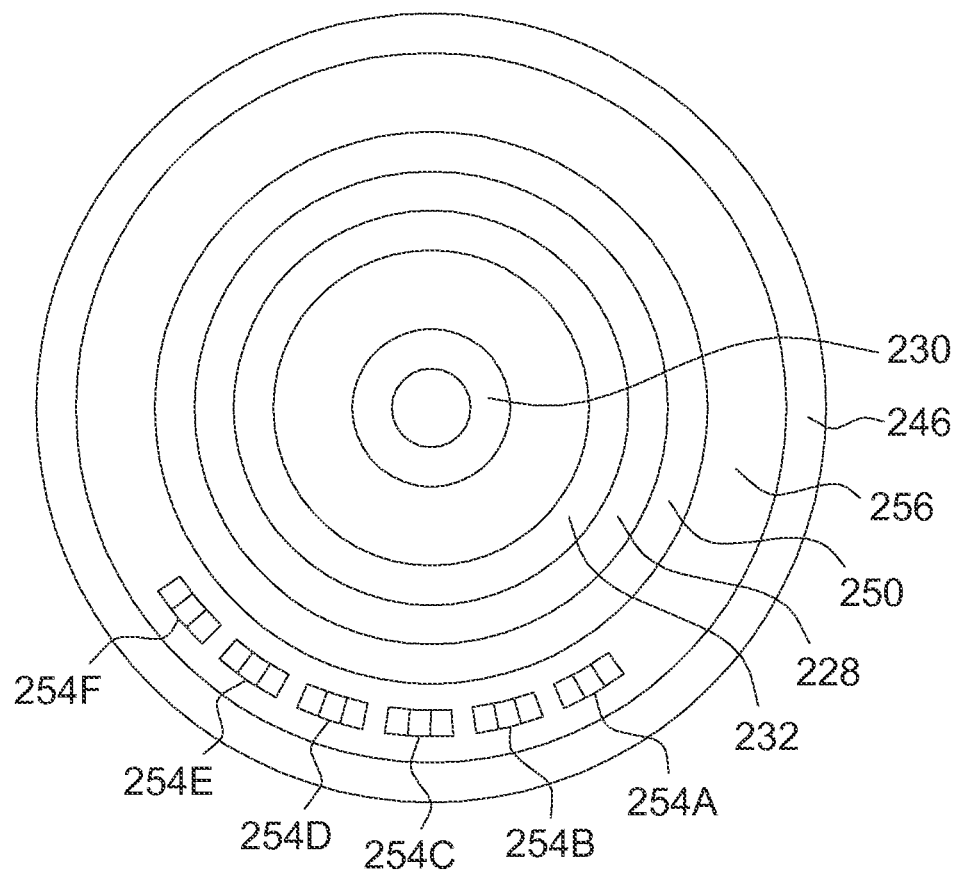
FIG. 5 illustrates a top view the semiconductor device in one embodiment.

FIG. 5 illustrates a top view the semiconductor device in one embodiment, showing for example the source 228, the drain 230, the gate 232, the doped region 246, the doped region 250, the dielectric structure 256. The semiconductor device shown in FIG. 5 may have the circuit shown in FIG. 1 and FIG. 2. The semiconductor device may comprise a first diode element and a second diode element. The first diode element has one diode 254A, and can be represented by the first circuit 8 shown in FIG. 2. The second diode element has a plurality of diodes 254B, 254C, 254D, 254E, 254F electrically connected to each other in series, and can be represented by the second circuit 10 as shown in FIG. 2. However, the present disclosure is not limited thereto. In other embodiments, the first diode element has a plurality of diodes electrically connected to each other in series. The second diode element has one diode.

In some embodiments, the diode has a strip shape as shown in FIG. 5. However, the present disclosure is not limited thereto. The diode may have a circle, square, ring, etc. shape.

In embodiments of the present disclosure, the start-up circuit is constituted by the semiconductor unit and the diode. The condition of the diode is properly adjusted according to a desired output voltage and the threshold voltage of the semiconductor unit. Therefore, a high output voltage can be obtained. In addition, the start-up circuit stopping working has low leakage current and low power dissipation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A start-up circuit, comprising:
   a semiconductor unit coupled to a first node and a second node;
   a first circuit, coupled between the first node and the second node, constituted by a plurality of diodes electrically connected in series and in the same direction, wherein an anode end of the first circuit is connected to the first node and a cathode end of the first circuit is connected to the second node;
   a second circuit, coupled between the first node and a ground terminal, constituted by a plurality of diodes electrically connected in series and in the same direction, wherein an anode end of the second circuit is directly connected to the ground terminal and a cathode end of the second circuit is connected to the first node;
   a voltage input terminal coupled to the semiconductor unit; and
   a single voltage output terminal coupled to the second node, connected directly to the cathode end of the first circuit, wherein a voltage from the single voltage output terminal forms a reverse bias to the diodes of the first circuit and the second circuit.

2. The start-up circuit according to claim 1, wherein, the semiconductor unit comprises a source, a drain and a gate,
   the voltage input terminal is coupled to one of the drain and the source,
   the single voltage output terminal is coupled to the other of the drain and the source,
   the first node is coupled to the gate.

3. The start-up circuit according to claim 1, wherein, the semiconductor unit is a depletion-type NMOS and comprises a source, a drain and a gate,
   the voltage input terminal is coupled to the drain,
   the single voltage output terminal is coupled to the source and a cathode of the diodes of the first circuit,
   the first node is among the gate, an anode of the diodes of the first circuit and a cathode of the diodes of the second circuit,
   an anode of the diodes of the second circuit is grounded.

4. The start-up circuit according to claim 1, wherein the diodes of the first circuit and the second circuit comprises P-N junction diode or Zener diode.

5. The start-up circuit according to claim 1, wherein the diodes of the first circuit have a reverse breakdown voltage substantially as same as a reverse breakdown voltage that the diodes of the second circuit have.

6. The start-up circuit according to claim 1, wherein the start-up circuit is applied for a switch mode power supply.

7. An operating method for a start-up circuit, wherein the start-up circuit comprises:
   a semiconductor unit coupled to a first node and a second node;
   a first circuit, coupled between the first node and the second node, constituted by a plurality of diodes electrically connected in series and in the same direction, wherein an anode end of the first circuit is connected to the first node and a cathode end of the first circuit is connected to the second node;
   a second circuit, coupled between the first node and a ground terminal, constituted by a plurality of diodes electrically connected in series and in the same direction, wherein an anode end of the second circuit is directly connected to the ground terminal and a cathode end of the second circuit is connected to the first node;
   a voltage input terminal coupled to the semiconductor unit; and
   a single voltage output terminal coupled to the second node, connected directly to the cathode end of the first circuit, the operating method for the start-up circuit comprising:
   providing an input voltage to the voltage input terminal to generate an electric current flowing from the voltage input terminal, through the semiconductor unit, to the single voltage output terminal to generate an output voltage at the single voltage output terminal, wherein the single output voltage forms a reverse bias to the diodes of the first circuit and the second circuit.

8. The operating method for the start-up circuit according to claim 7, wherein the input voltage is substantially close to the output voltage.

9. The operating method for the start-up circuit according to claim 7, further comprising cutting off the semiconductor unit.

10. The operating method for the start-up circuit according to claim 9, wherein a method for cutting off the semiconductor unit comprises making the start-up circuit conform to a condition that a voltage difference (VGS) between a gate and a source of the semiconductor unit is substantially higher than a threshold voltage of the semiconductor unit.

11. The operating method for the start-up circuit according to claim 7, wherein the operating method for the start-up circuit is applied for a switch mode power supply.

12. A semiconductor device, comprising:
    a semiconductor unit coupled to a first node and a second node, comprising a source, a drain and a gate between the source and the drain, wherein the gate is coupled to the first node;
    a first diode element coupled between the source and the gate, wherein an anode end of the first diode element is connected to the gate and a cathode end of the first diode element is connected to the source;
    a second diode element, coupled to the gate and the first circuit, wherein an anode end of the second diode element is directly connected to a ground terminal and a cathode end of the second diode element is connected to the first node; and
    a single voltage output terminal coupled to the second node between the source and the first diode element, and connected directly to the cathode end of the first diode element and for providing a voltage forming a reverse bias to the first diode element and the second diode element, wherein the first diode element and the second diode element respectively have a plurality of diodes electrically connected in series and in the same direction.

13. The semiconductor device according to claim 12, wherein a first voltage terminal is coupled to the drain.

14. The semiconductor device according to claim 13, wherein the first voltage terminal is a voltage input terminal.

15. The semiconductor device according to claim 14, wherein,
   the semiconductor unit is a depletion-type NMOS.

16. The semiconductor device according to claim 12, wherein,
   the semiconductor unit is a depletion-type NMOS,
   a first voltage terminal is coupled to the drain,
   a third voltage terminal is coupled to an anode of the second diode element.

17. The semiconductor device according to claim 12, wherein the first diode element and the second diode element comprises a P-N junction diode or a Zener diode.

18. The semiconductor device according to claim 12, further comprising a dielectric structure, wherein the first diode element and the second diode element are disposed on the dielectric structure and separated from the semiconductor device by the dielectric structure.

* * * * *